United States Patent
Foo et al.

[19]
[11] Patent Number: 5,828,310
[45] Date of Patent: Oct. 27, 1998

[54] INDICATOR SYSTEM HAVING PLURALITY OF FEEDERS AND ACTUATORS ARRANGED TO SELECTIVELY ACTUATE A SENSOR

[75] Inventors: Kean Fong Foo; Ka Tiek Lim; Ping Chow Teoh; Kon Hing Chooi, all of Penang, Malaysia

[73] Assignee: Motorola, Inc., Schaumburg, Ill.

[21] Appl. No.: 859,451

[22] Filed: May 20, 1997

[51] Int. Cl.⁶ .................................................. G08B 21/00
[52] U.S. Cl. ........................ 340/674; 29/741; 29/759; 250/223 R; 340/686
[58] Field of Search .................................. 340/679, 674, 340/555–557, 686; 250/222.1, 223 R, 224; 209/576; 29/829, 832, 846, 740, 741, 759

[56] References Cited

U.S. PATENT DOCUMENTS 4,637,134  1/1987  Tomita et al. ............................. 29/741
4,641,024  2/1987  Neri ...................................... 250/223 R

*Primary Examiner*—Thomas J. Mullen, Jr.
*Attorney, Agent, or Firm*—Dale W. Dorinski

[57] ABSTRACT

An indicator system (1) having a plurality of hoppers (2) for supplying electrical components (20) to respective dispensing locations. There are actuators (9) associated with the hoppers (2), the actuators (9) being movable during the dispensing. There is a sensor (13) selectively actuatable by some of the actuators (9) when the components (20) in one of the hoppers (2) are below a desired number or threshold level. The system (1) also has a visual indicator (14) coupled to the sensor (13) to provide a warning signal indicative of when the components (20) in one of the hoppers (2) are below the desired number.

15 Claims, 3 Drawing Sheets

INDICATOR SYSTEM HAVING PLURALITY OF FEEDERS AND ACTUATORS ARRANGED TO SELECTIVELY ACTUATE A SENSOR

FIELD OF THE INVENTION

This invention relates to an indicator system having a plurality of feeders and actuators arranged to selectively actuate an associated single sensor. The invention is particularly useful for, but not necessarily limited to, selectively indicating when electrical components in one of a plurality of feeders supplying electrical components for mounting to a circuit board are below a threshold level.

BACKGROUND ART

Component feeding is a well-known process in Surface Mounting Technology (SMT). In general, a feeder is used to sequentially supply surface mountable electrical components to a pick up location for subsequent placing, by a pick-and-place machine, onto a Printed Circuit Board (PCB) which is usually pre-printed with solder paste.

One form of feeder is a tape and reel feeder in which the electrical components are packaged on a tape that is wound onto a reel. The tape comprises individual pockets each containing one of the electrical components that are individually sealed in the pockets by a covering of thin film. In use, the film is removed when the tape enters the pick up location therefore allowing the component in the pocket to be accessible by a pick-up member of the pick-and-place machine.

Hopper feeders also known as bulk or tube feeders are an alternative to tape and reel feeders. Hopper feeders comprise a hopper in communication, along a downwardly sloping passage, with the pick up location. The downwardly sloping passage makes use of gravity for supplying the components to the pick up location. To further assist the supplying of the components to the pick up location a combination of gravity and air blasting has also been used.

In use, both conventional hopper feeders or tape and reel feeders are usually positioned on either sides of a conveyor track extending along a length of a pick-and-place machine. The conveyor track transports printed circuit boards into an area of the pick-and-place machine to allow components, fed from the hopper feeders or tape and reel feeders, to be mounted to the circuit boards. Such pick-and-place machines are expensive and any production stoppages are highly undesirable. However, stoppages can occur due undetected exhaustion of the components supplied by the hopper feeder or by an undetected end of tape condition of the tape reel feeder. As a result, in a busy noisy factory with many machines and many hoppers and tape and reel feeders the exhaustion of components may go undetected for many seconds or even minutes. This is therefore highly undesirable and can result in increased production costs.

One approach to overcome or alleviate increased production costs due to undetected exhaustion of components would be to have an individual sensor for each hopper or tape and reel feeder. When the component supply of an individual hopper or tape and reel feeder falls below a threshold level, a signal can be provided to an operator who can then take corrective action. However, this would be costly as it requires may sensors and may not be practical due to the limited space available. Further, individual sensors may also affect operator accessibility to the hoppers, tape and reel feeders and the machine in general.

SUMMARY OF THE INVENTION

It is an aim of this invention to overcome or alleviate at least one of the above problems or provide the public with a useful alternative to existing indicator systems.

According to one aspect of this invention there is provided an indicator system comprising:

a plurality of feeders for supplying electrical components to respective dispensing locations;

a sensor;

actuators associated with respective ones of said feeders, said actuators being movable relative to said sensor to thereby selectively actuate said sensor when said components in one of said respective feeders are below a desired number; and a signaling means coupled to said sensor to provide a warning signal indicative of said components associated with one of said feeders being below said desired number.

Preferably said feeders may be hoppers.

Suitably said actuators may include slidable members slidably associated with respective ones of said hoppers to allow relative slidable movement therebetween.

Preferably, said slidable members may have an abutment surface for abutting some of the said components in a respective one of said hoppers.

Suitably, said slidable members may be slidably mounted inside a respective one of said hoppers.

Preferably said slidable members may have a lateral extending portion for activating sensing beam of said sensor.

In an alternative suitable form, said slidable members may have a slot therein, said slot being aligned with a sensing beam of said sensor during some of said slidable movement.

Suitably, said slidable members associated with said sensor may be substantially aligned.

Preferably said abutment surface may have resilient or plastic properties.

In an alternative form, said feeders may include tape and reel feeders, wherein said actuators are tape portions thereof.

Suitably, an end of reel condition of each one of said tape and reel feeders may provide selective actuation of said sensor.

Preferably, said tape of each tape and reel feeder may have one or more supports for keeping said tape away from a sensing beam of said sensor until said end of reel condition results.

Suitably, said sensor may comprise a transmitter and receiver operatively coupled by said sensing beam.

Suitably, said transmitter may include a reflector for reflecting said beam. Alternatively, said transmitter may be located opposite said receiver.

Suitably, said signaling means may be a visual indicator. Alternatively, said signaling means may provide an audible signal or a visual and/or audible signal.

BRIEF DESCRIPTION OF THE DRAWINGS

In order that the invention may be readily understood and put into practical effect, reference will now be made to preferred embodiments illustrated in the accompanying drawings in which.

DETAILED DESCRIPTION OF THE PREFERRED EMBODIMENTS OF THE INVENTION

Figure 1:
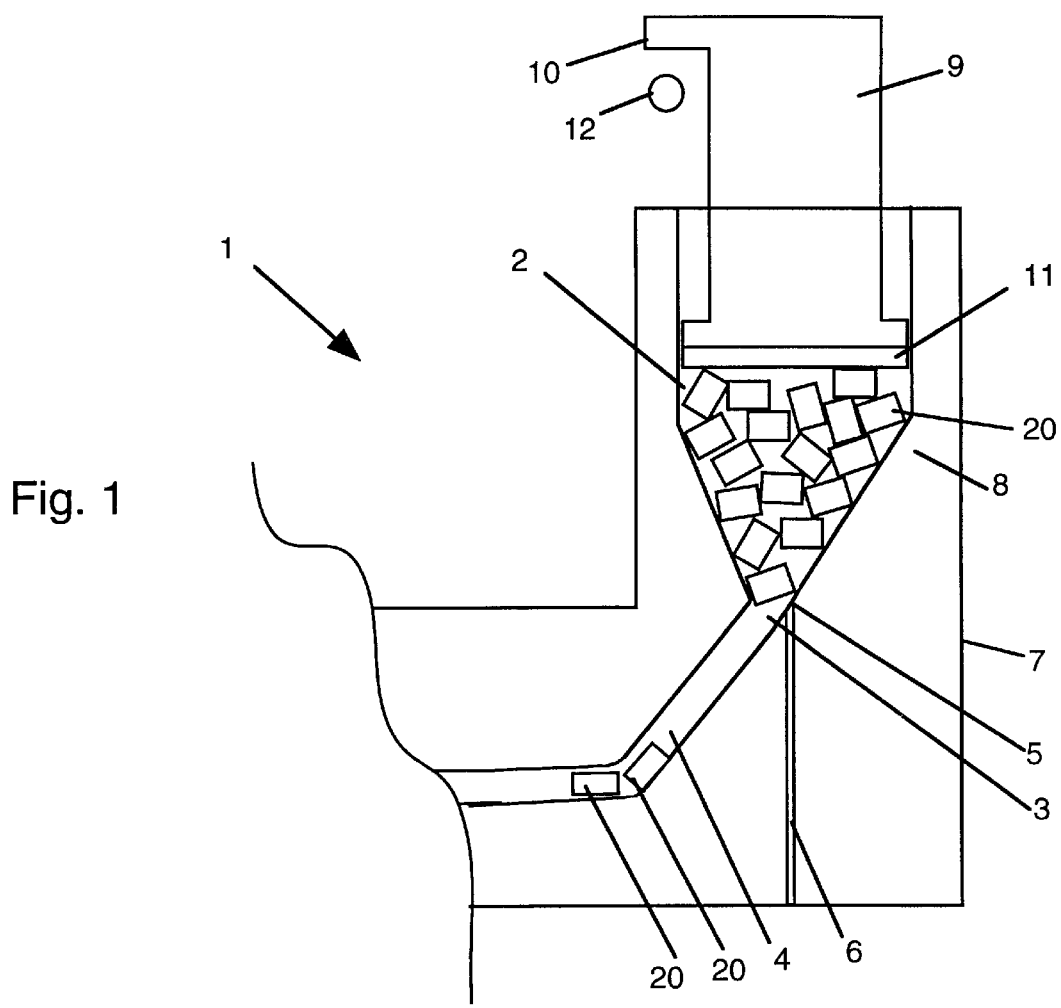
FIG. 1 is a side view of a preferred embodiment of an indicator system in accordance with the invention.
Figure 2:
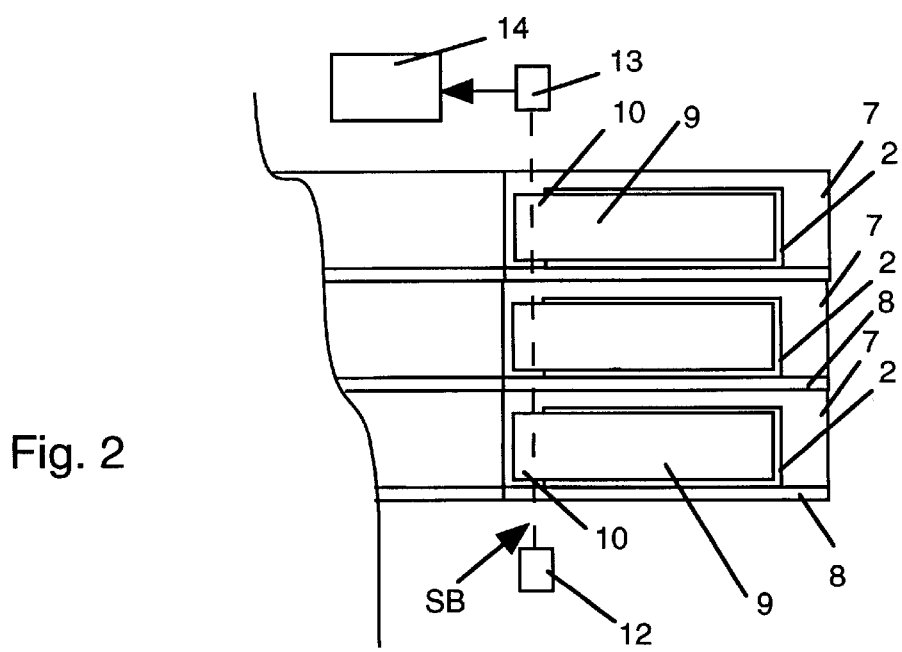
FIG. 2 is a plan view of the indicator system of FIG. 1.

Referring to FIGS. 1 and 2 there is illustrated an indicator system 1 for supplying electrical components 20 to dispensing locations (not shown) which are typically pick-up locations of a pick-and-place machine. The indicator system 1 comprises a plurality of feeders in the form of hoppers 2 each having a hopper outlet 3 and a channel 4. The channel 4 provides communication between the hopper 2 and the pick-up locations so that a reservoir of electrical components 20 in hopper 2 can transferred from the hopper 2 to the pick-up locations.

There is a combined agitator and fluid pushing means in the form of an air jet nozzle 5 located in hopper 2, adjacent the hopper outlet 3. The air jet nozzle 5 allows for agitating the components 20 in hopper 2 and pushing the component 20 along channel 4 as will be apparent to a person skilled in the art. In this regard, there are air conduits 6 for allowing air to be supplied to nozzle 5 to provide air blast to agitate components 20.

The channel 4, pick up locations, hopper 2 and air conduits 6 are machined into a surface of a block 7 and enclosed by a transparent plate 8 that is bolted to the block 7 (bolts not shown).

The indicator system 1 also comprises actuators in the form of slidable members 9 slidably mounted inside a respective one of hoppers 2. Each of the slidable members 9 have a lateral extending portion 10 and an abutment surface 11 in abutment with some of the reservoir of electrical components 20. Abutment surface 11 has resilient or plastic properties to reduce the possibility of damage to components 20. The indicator system 1 also has a sensor in the form of a transmitter 12 located opposite a receiver 13 and are in communication by a sensing beam SB. The receiver 13 is coupled to a visual indicator 14.

In use, components 20 in each of hoppers 2 will be dispensed to the pick-up locations and therefore the reservoir of components 20 will gradually diminish. As a result, slidable members 9 will gradually slide in a direction towards outlet 3 and depending upon the number of components 20 in each hopper 2, at some point a lateral extending portion 10 will break sensing beam SB. The receiver 13 is therefore selectively actuatable by each actuator 9 when the components 20 of the associated hopper 2 are below a desired number (threshold level). This results in the visual indicator 14 providing a warning signal indicative of the components 20, in at least one of hoppers 2, being below the desired number and therefore an operator can replenish the components 20 before they run out.

Figure 3:
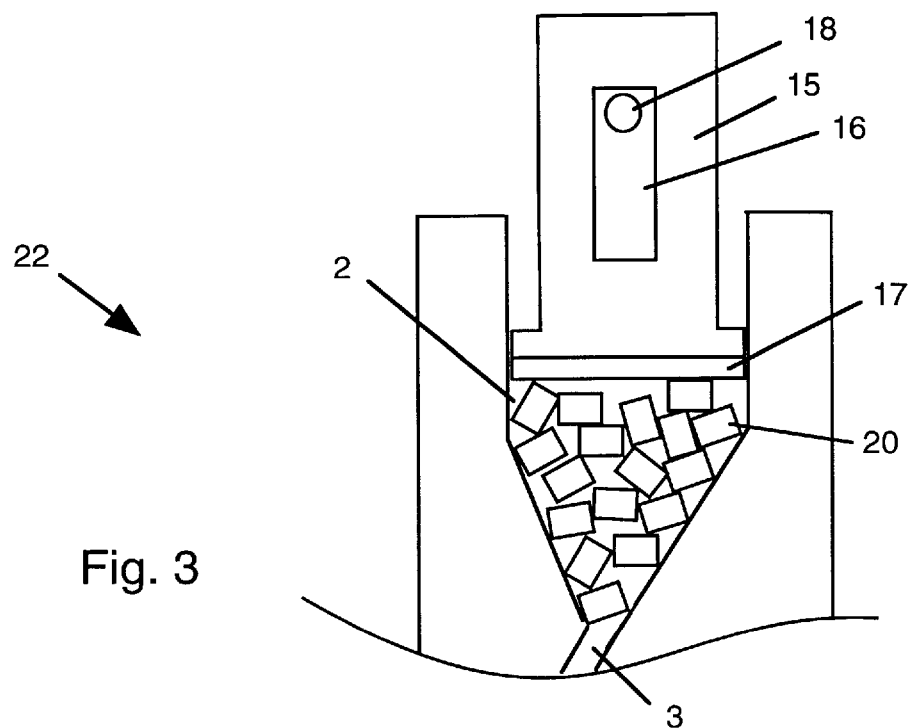
FIG. 3 is a side view of a second preferred embodiment of part of an indicator system in accordance with the invention.
Figure 4:
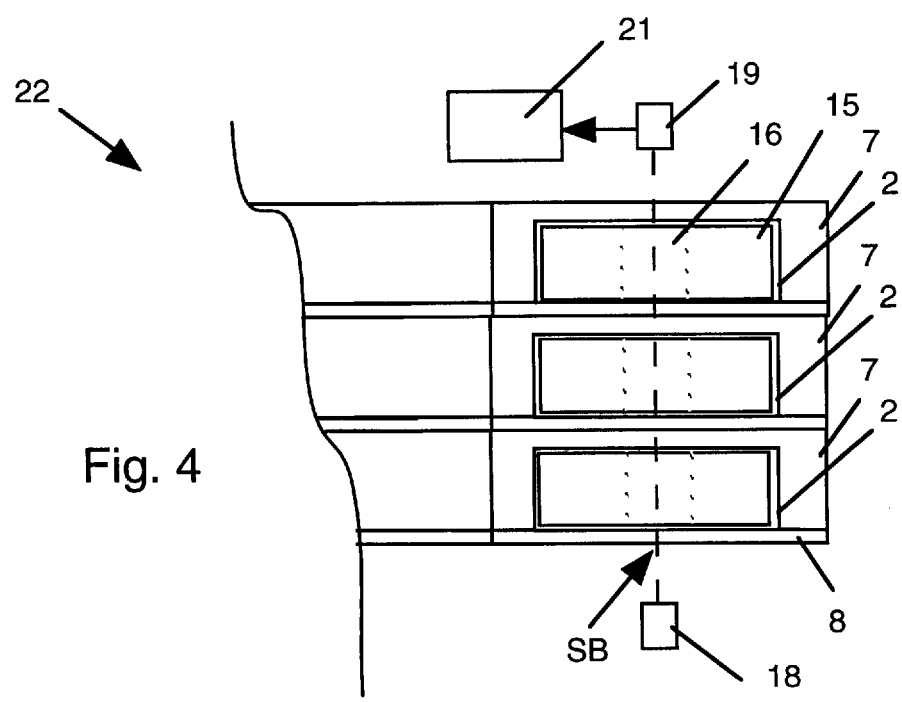
FIG. 4 is a plan view of the indicator system in FIG. 3.

Referring to FIGS. 3 and 4 there is illustrated a second embodiment of an indicator system 22 which is substantially the same as the system illustrated in FIGS. 1 and 2. Accordingly, to avoid repetition, only the major differences are described.

Indicator system 22 has a plurality of hoppers 2 each containing a reservoir of components 20 and respective outlets 3 for allowing components 20 to be transferred from hoppers 2 to pick-up locations. Actuators in the form of slidable members 15 are slidably mounted in a respective one of hoppers 2. Each of the slidable members 15 have a slot 16 and abutment surface 17 in abutment with some of electrical components 20. To reduce the possibility of damage to components 20, each abutment surface 17 has resilient or plastic properties. The indicator system 22 also has a sensor in the form of a transmitter and receiver module 19 comprising a transmitter and receiver in communication with each other by a sensing beam SB. The sensing beam SB is transmitted from a transmitter and is reflected off a reflector 18 towards the receiver of module 19. Further, coupled to module 19 is an audio visual indicator 21.

The slot 16 of each slidable member 15 is aligned with sensing beam SB during part of the slidable movement of member 15 in a respective one of hoppers 2.

In use, when all hoppers 20 associated with module 19 have an acceptable reservoir level of components 20, all the associated slots 16 will be aligned with sensing beam SB. However, if components 20 in any of hoppers 2 deplete below a desired number (threshold level) the slot 15 of the associated slidable member 16 will no longer be aligned with sensing beam SB. Accordingly, part of slidable member 15 will break sensing beam SB therefore actuating the receiver of module 19. As a result, audio visual indicator 21 will emit an alert signal. This alert indicates that the components 20 in at least one of the hoppers 2 is below desired number. An operator can therefore replenish the reservoir of components 20 in the respective one of the hoppers 2 before they run out.

Figure 5:
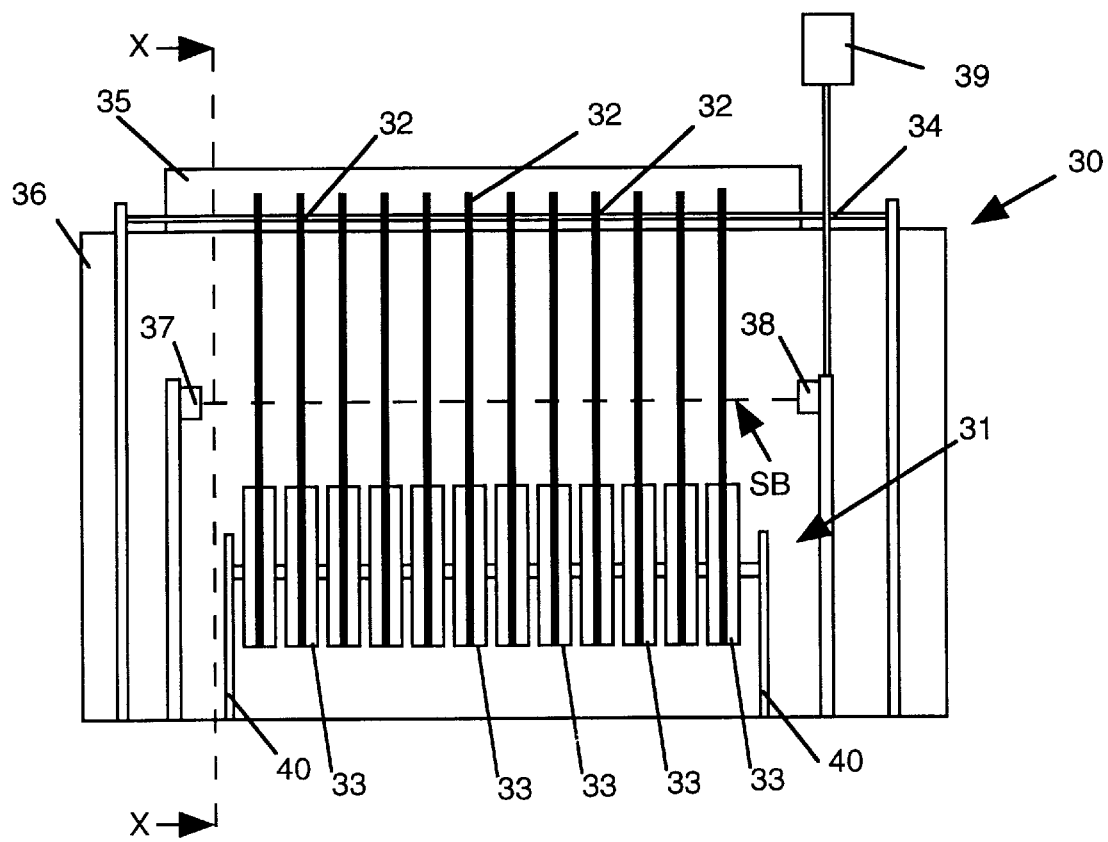
FIG. 5 is a plan view of a third preferred embodiment of an indicator system in accordance with the invention.
Figure 6:
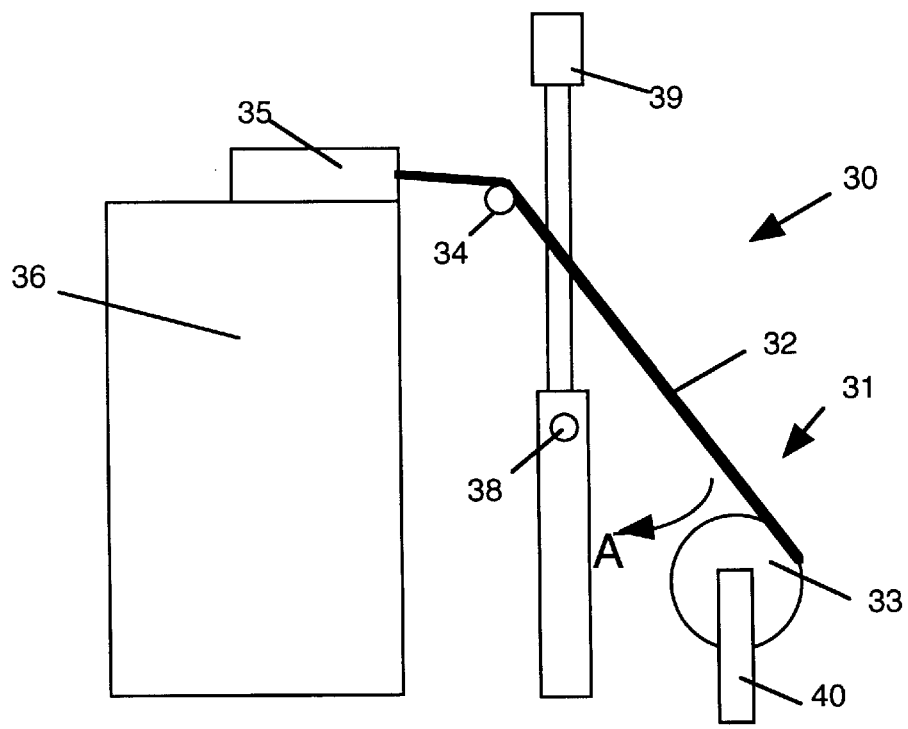
FIG. 6 is a cross-sectional side view through X—X of FIG. 5.

Referring to FIGS. 5 and 6 there is illustrated a third embodiment of a indicator system 30 for supplying electrical components to dispensing locations 35 of a pick-and-place machine 36. The indicator system 30 comprises a plurality of tape and reel feeders 31 comprising a respective reel 33 having a tape 32 wound thereon. As apparent to the skill addressee, the tape 32 has pockets containing electrical components which are transferred sequentially to dispensing locations 35. The reel portions 33 are pivotally mounted to mounts 40.

The indicator system 30 also comprises actuators in the form of tape portions of tape 32, and the sensor in the form of a transmitter 37 located opposite a receiver 38 which are in communication by sensing beam SB. The receiver 38 is coupled to a visual indicator 39 which is coupled to indicator 21 to emit a warning signal upon receipt of a signal from receiver 38. There is also provided a support 34 for keeping the tape portion of tape 32 away from the sensing beam SB during normal operation. However, when an end of reel condition of one of the tape and reel feeders 31 occurs, the tail end of the tape 31, as would be apparent to a person skilled in the art, will swing in the direction of arrow A. As a result, this will break sensing beam SB for a short period of time therefore actuating receiver 38 which in turn activates indicator 39. The visual indicator therefore provides a warning signal indicative of an impending end of reel condition. An operator can therefore attend to this matter by replacing the tape and reel feeder whilst not duly affecting the operation of the pick-and-place machine 36. The system 30 is then reset as will be apparent to a person skilled in the art.

The present invention advantageously provides a warning signal to an operator of an impending shortage of components in a feeder which for example may be a hopper or a tape and reel feeder. In this regard, a common sensor is used to selectively detect the impending shortage of components. The use of a common sensor has the advantage of reducing the cost that would be associated with a use of a sensor for each feeder. Furthermore, the use of a common sensor also allows for relatively easy accessibility to, for example the hoppers, the tape and reel feeders or pick-and-place machines in general.

Although this invention has been described with reference to preferred embodiments, it is to be understood that the invention is not limited to the specific embodiments described herein.

We claim:

1. An indicator system comprising:
    a plurality of feeders for supplying electrical components to respective dispensing locations;
    a sensor;
    actuators associated with respective ones of said feeders, said actuators being movable relative to said sensor to thereby selectively actuate said sensor when said components in one of said respective feeders are below a desired number; and
    a signaling means coupled to said sensor to provide a warning signal indicative of said components associated with one of said feeders being below said desired number.

2. An indicator system as claimed in claim 1, wherein said feeders are hoppers.

3. An indicator system as claimed in claim 2, wherein said actuators include slidable members slidably associated with respective ones of said hoppers to allow relative slidable movement therebetween.

4. An indicator system as claimed in claim 3, wherein said slidable members have an abutment surface for abutting some of the said components in a respective one of said hoppers.

5. An indicator system as claimed in claim 4, wherein said slidable members are slidably mounted inside a respective one of said hoppers.

6. An indicator system as claimed in claim 5, wherein said slidable members have a lateral extending portion for activating a sensing beam of said sensor.

7. An indicator system as claimed in claim 4, wherein said slidable members associated with said sensor are substantially aligned.

8. An indicator system as claimed in claim 4, wherein said abutment surface has resilient or plastic properties.

9. An indicator system as claimed in claim 3, wherein said slidable members have a slot therein, said slot being aligned with a sensing beam of said sensor during some of said slidable movement.

10. An indicator system as claimed in claim 9, wherein said sensor comprises a transmitter and receiver operatively coupled by said sensing beam.

11. An indicator system as claimed in claim 10, wherein said transmitter includes a reflector for reflecting said beam.

12. An indicator system as claimed in claim 10, wherein said transmitter is located opposite said receiver.

13. An indicator system as claimed in claim 1, wherein feeders include tape and reel feeders, wherein said actuators are tape portions thereof.

14. An indicator system as claimed in claim 13, wherein an end of reel condition of each one of said tape and reel feeders provides selective actuation of said sensor.

15. An indicator system as claimed in claim 14, wherein said tape of each tape and reel feeder has one or more supports for keeping said tape away from a sensing beam of said sensor until said end of reel condition results.

* * * * *